(12) United States Patent
Aritome (10) Patent No.: US 8,441,058 B2
(45) Date of Patent: May 14, 2013

(54) MEMORY DEVICES HAVING REDUCED INTERFERENCE BETWEEN FLOATING GATES AND METHODS OF FABRICATING SUCH DEVICES

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/180,361

(22) Filed: Jul. 11, 2011

(65) Prior Publication Data

US 2011/0266610 A1 Nov. 3, 2011

Related U.S. Application Data

(62) Division of application No. 11/471,772, filed on Jun. 21, 2006, now Pat. No. 7,977,190.

(51) Int. Cl.
*H01L 29/788* (2006.01)
(52) U.S. Cl.
USPC .............. 257/316; 257/E29.03; 257/E21.209; 438/211
(58) Field of Classification Search ................... 257/316, 257/E29.3; 438/211
See application file for complete search history.

(56) References Cited

U.S. PATENT DOCUMENTS

| | | | |
|---|---|---|---|
| 5,949,101 A | 9/1999 | Aritome | |
| 6,228,713 B1 * | 5/2001 | Pradeep et al. | 438/257 |
| 6,713,834 B2 | 3/2004 | Mori et al. | |
| 6,884,680 B2 | 4/2005 | Koh | |
| 6,903,406 B2 | 6/2005 | Lee et al. | |
| 6,940,780 B2 | 9/2005 | Chevallier | |
| 6,951,790 B1 | 10/2005 | Violette | |
| 6,967,892 B2 | 11/2005 | Tanaka et al. | |
| 6,982,905 B2 | 1/2006 | Nguyen | |
| 6,996,004 B1 | 2/2006 | Faslow et al. | |
| 7,015,098 B2 | 3/2006 | Rudeck | |
| 7,019,355 B2 | 3/2006 | Sakuma et al. | |
| 7,045,419 B2 | 5/2006 | Luoh et al. | |
| 7,387,934 B2 | 6/2008 | Ozawa et al. | |
| 7,629,232 B2 | 12/2009 | Tanaka et al. | |
| 2005/0106813 A1 | 5/2005 | Lee et al. | |

* cited by examiner

*Primary Examiner* — Eugene Lee
*Assistant Examiner* — Elias M Ullah
(74) *Attorney, Agent, or Firm* — Fletcher Yoder (57) ABSTRACT

A memory array comprising transistors having isolated inter-gate dielectric regions with respect to one another. Transistors are formed such that each of the transistors in the array has a charge storage region such as a floating gate, a control gate and an inter-gate dielectric layer therebetween. The inter-gate dielectric layer for each transistor is isolated from the inter-gate dielectric of each of the other transistors in the array.

20 Claims, 8 Drawing Sheets

MEMORY DEVICES HAVING REDUCED INTERFERENCE BETWEEN FLOATING GATES AND METHODS OF FABRICATING SUCH DEVICES

CROSS-REFERENCE TO RELATED APPLICATION

This application is a divisional of U.S. patent application Ser. No. 11/471,772, which was filed on Jun. 21, 2006, now U.S. Pat. No. 7,977,190, which issued on Jul. 12, 2011.

BACKGROUND OF THE INVENTION

1. Field of the Invention

Embodiments of the present invention relate generally to memory devices and more specifically to floating gate memory devices having reduce interference between adjacent floating gates.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Processor-based systems, such as computers, typically include one or more memory devices to provide storage capability for the system. System memory is generally provided in the form of one or more integrated circuit chips or devices and generally includes both random access memory (RAM) and read-only memory (ROM). System RAM is typically large and volatile and provides the system's main memory. Static RAM and Dynamic RAM are commonly employed types of random access memory. In contrast, system ROM is generally small and includes non-volatile memory for storing initialization routines and identification information. Electrically-erasable read only memory (EEPROM) is one commonly employed type of read only memory, wherein an electrical charge may be used to program and/or erase data in the memory.

One type of non-volatile memory that is of particular use is a flash memory. A flash memory is a type of EEPROM that can be erased and reprogrammed in blocks. Flash memory is often employed in personal computer systems in order to store the Basic Input Output System (BIOS) program such that it can be easily update. Flash memory is also employed in wireless electronic devices because it enables the manufacturer to support new communication protocols as they become standardized and to provide the ability to remotely upgrade the device for enhanced features.

A typical flash memory includes a memory array having a large number of memory cells arranged in rows and columns. The memory cells are generally grouped into blocks such that groups of cells can be programmed or erased simultaneously. Each of the memory cells includes a floating-gate field-effect transistor capable of holding a charge. Floating gate memory cells differ from standard MOSFET designs in that they include an electrically isolated gate, referred to as the "floating gate," in addition to the standard control gate. The floating gate is generally formed over the channel and separated from the channel by a gate oxide. The control gate is formed directly above the floating gate and is separated from the floating gate by another thin oxide layer. A floating gate memory cell stores information by holding electrical charge within the floating gate. By adding or removing charge from the floating gate, the threshold voltage of the cell changes, thereby defining whether this memory cell is programmed or erased.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a word-select line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bit line.

The memory array is accessed by a row decoder activating a row of memory cells by selecting the word-select line connected to a control gate of a memory cell. In addition, the word-select lines connected to the control gates of unselected memory cells of each string are driven to operate the unselected memory cells of each string as pass transistors, so that they pass current in a manner that is unrestricted by their stored data values. Current then flows from the source line to the column bit line through each NAND string via the corresponding select gates, restricted only by the selected memory cells of each string. This places the current-encoded data values of the row of selected memory cells on the column bit lines.

With today's ever-decreasing device geometries, the extreme density of the memory devices may introduce a number of inter-component interactions which may be undesirable. For instance, interference between adjacent memory cells is of growing concern as the size of the memory cells decrease. For floating gate memory cells in particular, interference between adjacent floating gates is generally undesirable.

Embodiments of the present invention may be directed to one or more of the problems set forth above.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
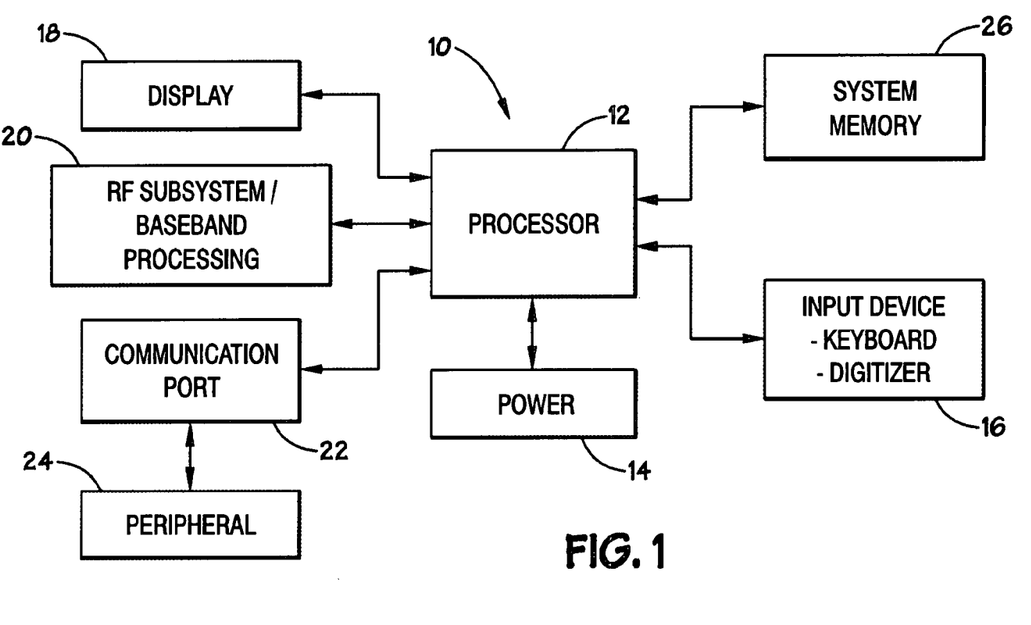
FIG. 1 illustrates a block diagram of an exemplary processor-based device having a memory that includes memory devices fabricated in accordance with embodiments of the present invention.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory 28, such as read-only memory (ROM), EEPROM, and/or flash memory to be used in conjunction with the volatile memory. As described further below, the system memory 26 may include one or more memory devices, such as flash memory devices, that may include a floating gate memory array fabricated in accordance with embodiments of the present invention.

Figure 2:
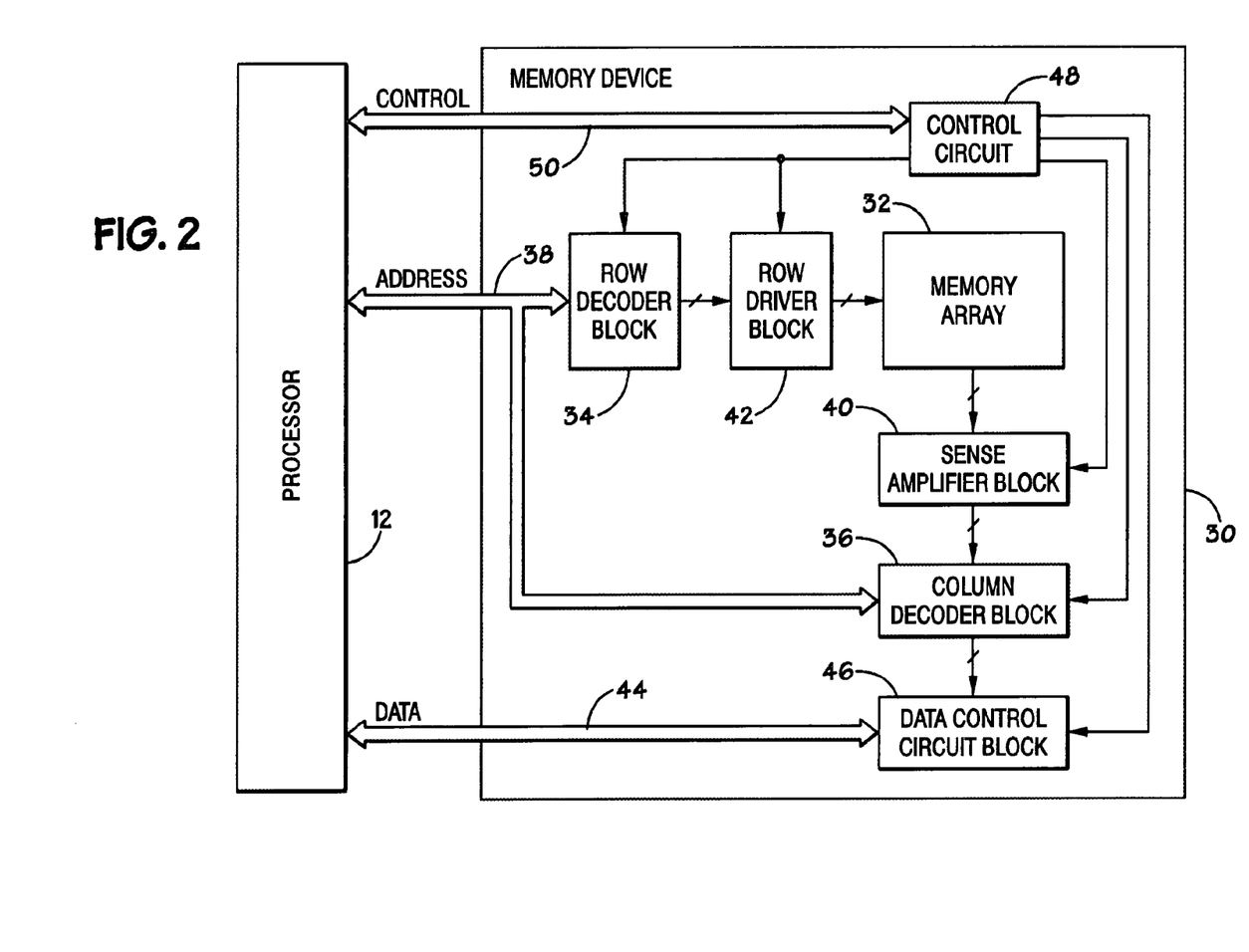
FIG. 2 illustrates a block diagram of an exemplary memory device having a memory array fabricated in accordance with embodiments of the present invention.

FIG. 2 is a block diagram illustrating a flash memory device 30 that may be included as a portion of the system memory 26 of FIG. 1. As will be described further below with respect to FIG. 3, the flash memory device 30 may be a NAND flash memory device. The flash memory device 30 generally includes a memory array 32. The memory array 32 generally includes many rows and columns of conductive traces arranged in a grid pattern to form a number of memory cells. The rows or "row lines" that make up the memory array 32 are generally referred to as "wordlines." The columns or "column lines" are generally referred to as "bit lines" or "digit lines." The size of the memory array 32 (i.e., the number of memory cells) will vary depending on the size of the flash memory device 30.

To access the memory array 32, a row decoder block 34 and a column decoder block 36 are provided and are configured to receive and translate address information from the processor 12 via the address bus 38 to access a particular memory cell in the memory array 32. A sense amplifier block 40 having a plurality of the sense amplifies is also provided between the column decoder 36 and the memory array 32 to sense and amplify individual values stored in the memory cells. Further, a row driver block 42 is provided between the row decoder block 34 and the memory array 32 to activate a selected word lines in the memory array according to a given row address.

During read and write operations, data may be transferred to and from the flash memory device 30 via the data bus 44. The coordination of the data and address information may be conducted through a data control circuit block 46. Finally, the flash memory device 30 may include a control circuit 48 configured to receive control signals from the processor 12 via the control bus 50. The control circuit 48 is coupled to each of the row decoder block 34, the column decoder block 36, the sense amplifier block 40, the row driver block 42 and the data control circuit block 46, and is generally configured to coordinate timing and control among the various circuits in the flash memory device 30.

Figure 3:
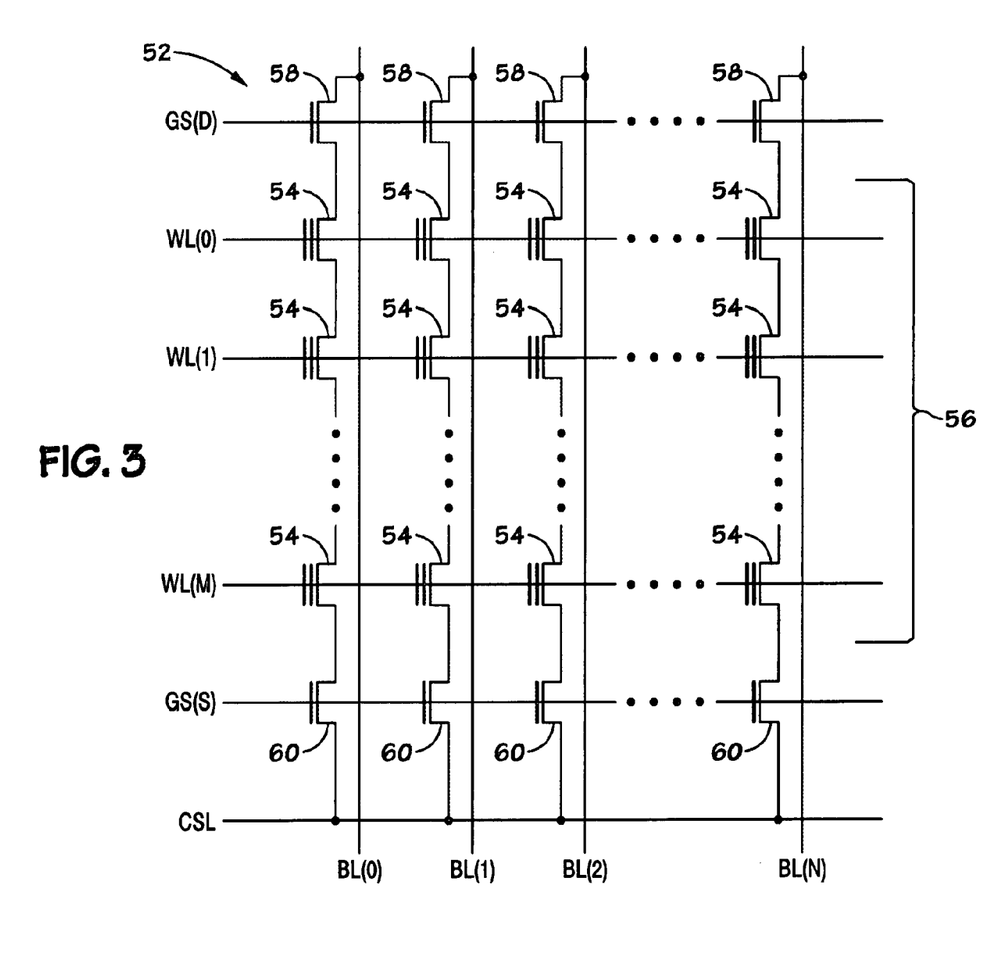
FIG. 3 is schematic diagram of an exemplary NAND flash memory array having memory cells fabricated in accordance with embodiments of the present invention.

FIG. 3 illustrates an exemplary embodiment of the memory array 32, of FIG. 2. In the present exemplary embodiment, the memory array 32 comprises a NAND memory array 52. The NAND memory array 52 includes word lines WL(0)-WL(M) and intersecting local bit lines BL(0)-BL(M). As will be appreciated, for ease of addressing in the digital environment, the number of word lines WL and the number of bit lines BL are each a power of two (e.g., 256 word lines WL by 4,096 bit lines BL). The local bit lines BL are coupled to global bit lines (not shown) in a many-to-one relationship.

The NAND memory array 52 includes a floating gate transistor 54 located at each intersection of a word line WL and a local bit line BL. The floating gate transistors 54 serve as non-volatile memory cells for storage of data in the NAND memory array 52, as previously described. As will be appreciated, each floating gate transistor includes a source, a drain, a floating gate, and a control gate. The control gate of each floating gate transistor 54 is coupled to a respective word line WL. The floating gate transistors 54 are connected in series, source to drain, to form a NAND string 56 formed between gate select lines. Specifically, the NAND strings 56 are formed between the drain select line GS(D) and the source select line GS(S). The drain select line GS(D) is coupled to each NAND string 56 through a respective drain select gate 58. Similarly, the source select line GS(S) is coupled to each NAND string 56 through a respective source select gate 60. The drain select gates 58 and the source select gates 60 may each comprise a field-effect transistor (FET), for instance. A column of the memory array 52 includes a NAND string 56 and the source select gate 60 and drain select gate 58 connected thereto. A row of the floating gate transistors 52 are those transistors commonly coupled to a given word line WL.

The source of each source select gate 60 is connected to a common source line CSL. The drain of each source select gate is coupled to the drain of a floating gate transistor 54 in a respective NAND string 56. The gate of each source select gate 60 is coupled to the source select line GS(S).

The drain of each drain select gate 58 is connected to a respective local bit line BL for the corresponding NAND string 56. The source of each drain select gate 58 is connected to the drain of a floating gate transistor 54 of a respective NAND string 56. Accordingly, as illustrated in FIG. 3, each NAND sting 56 is coupled between a respective drain select gate 58 and source select gate 60. The gate of each drain select gate 58 is coupled to the drain select line GS(D).

During operation of the NAND memory array 52, the close proximity and physical construction of the individual memory cells (floating gate transistors 54) may result in interference between adjacent memory cells. For instance, during a read operation, the source select line GS(S) and drain select line GS(D) are enabled. The source select line GS(S) and drain select line GS(D) may be biased to a voltage of 4.5V, for example. The biasing of source select line GS(S) and drain select line GS(D) turns on the respective source select gate 60 and drain select gate 58. During operation, capacitive interference between adjacent floating gates ("FG-FG interference" or "FG-FG capacitance") may negatively affect the operation of the NAND memory array 52. The FG-FG interference of many conventional floating memory cells is briefly described and illustrated with respect to FIGS. 4 and 5, below.

Figure 4:
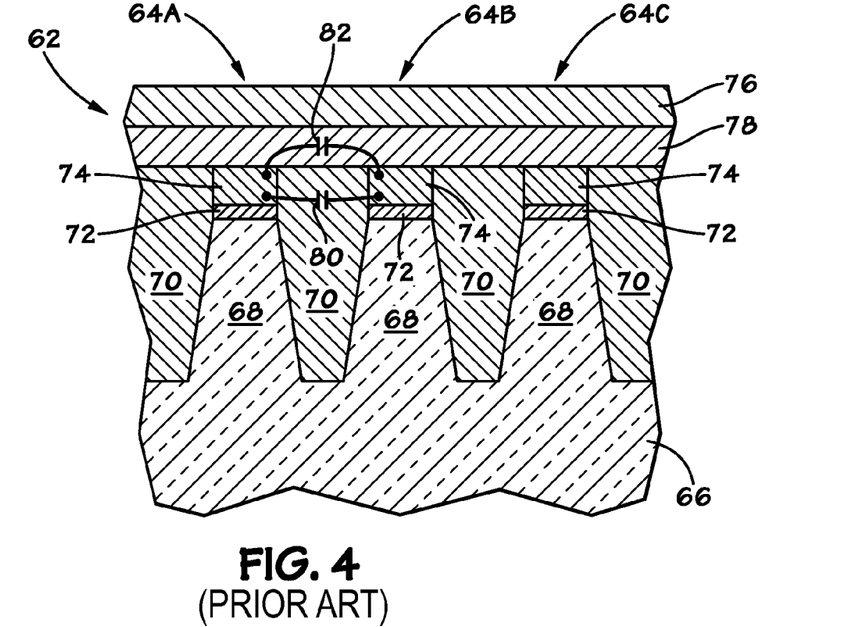
FIGS. 4 and 5 illustrate cross-sectional views of conventional floating gate memory devices.

Turning briefly to FIG. 4, a cross-sectional view of a portion of a conventional floating gate memory array, such as a NAND memory array, is illustrated and generally designated by reference numeral 62. Structure 62 illustrates a cross-sectional view of three floating gate transistors 64A-64C, taken along the word line WL of a floating gate memory array. The structure 62 comprises a substrate 66, which may be silicon, for example. To provide isolation between each of the floating gate transistors 64A-64C along a word line WL, shallow trenches are formed in the substrate 66 and filled with dielectric material, such as an oxide, to create vertical pillars 68 separated by shallow trench isolation (STI) oxide regions 70. As will be appreciated, the pillars 68 extend into the page along the bit line BLs of the array. Doped regions (not visible in the illustrated view) are formed in the upper portions of the pillars 68 to provide the source and drain of each of the floating gate transistors 64A-64C.

Each floating gate transistors 64A-64C generally includes a gate oxide 72, such as silicon dioxide ($SiO_2$). Each floating gate transistor 64A-64C also includes an isolated floating gate 74. The floating gate 74 may comprise polysilicon, for example. As previously discussed, each floating gate transistor 64A-64C further also includes a control gate, which may be formed of a single conductive layer, such as polysilicon, which is generally illustrated by reference numeral 76. Because of the configuration and operation of the array, each of the floating gate transistors 64A-64C in a single word line WL may share a common control gate 76, as illustrated in FIG. 4. The floating gates 74 and control gate 76 are electrically isolated from one another by an inter-gate dielectric layer 78. The inter-gate dielectric layer may comprise $SiO_2$ or $SiN_x$, for example. However, the inter-gate dielectric is typically a material having a higher dielectric constant (k) than those of $SiO_2$ or $SiN_x$, for example, as will be discussed further below.

As previously described, the small pitch between adjacent floating gates 74 may result in increased FG-FG interference. For instance, FG-FG interference may occur through the STI oxide, as illustrated by the capacitor 80. While this small amount of FG-FG interference may be tolerable, the FG-FG interference through the inter-gate dielectric layer 78, represented by the capacitor 82, may be less tolerable. This is especially true of a high-k dielectric material (e.g., wherein k>10). As will be appreciated, the capacitances 80 and 82 are generally determined by the following equation:

$$C = \frac{k\varepsilon_0 A}{t}$$

where
A is the capacitive area
$\varepsilon_0$ is the permittivity of free space
k is the dielectric constant of the material
t is the thickness of the material.

As will be appreciated, high-k materials are often employed to reduce tunneling current and out diffusion from the floating gate 74 and the control gate 76. However, the high-k material also has the disadvantageous effect of increasing the FG-FG capacitance 82 through the inter-gate dielectric layer 78. Thus, the FG-FG capacitance 82 is increased as materials having higher dielectric constants are employed as the inter-gate dielectric layer 78. Embodiments of the present invention may reduce the FG-FG capacitance 82 through the inter-gate dielectric layer 78, by eliminating the capacitive path between the floating gates 74 through the inter-gate dielectric layer 78, as will be described further below with respect to FIGS. 6-12.

Figure 5:
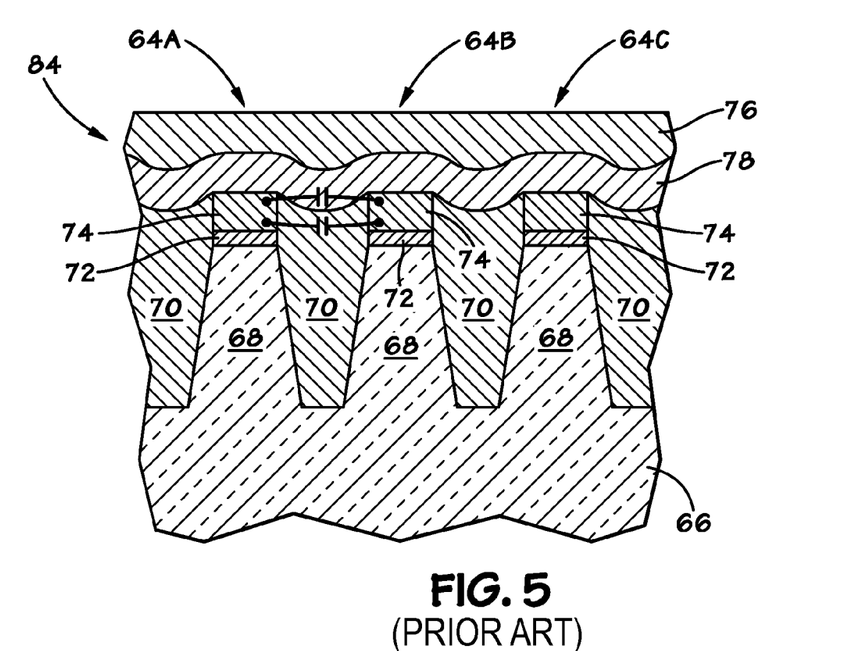

Referring now to FIG. 5, a structure 84 is illustrated. The structure 84 is identical to the structure 62 of FIG. 4, except that the inter-gate dielectric layer 78 dips between the floating gates 74 in the STI oxide 70 regions. In certain processes for fabricating a floating gate transistor 64A-64C, the STI oxide 70 may be over etched such that when the inter-gate dielectric 78 is disposed it dips between the floating gates 74, creating a more direct path of interference between the floating gates 74. As will be appreciated, the conventional structure 84 of FIG. 5 may be even more susceptible to the disadvantageous FG-FG capacitance 82, because of the inter-gate dielectric layer 78 creates a shorter capacitive path between adjacent floating gates 74. Embodiments of the present invention may reduce the FG-FG capacitance 82 through the inter-gate dielectric layer 78, by eliminating the capacitive path between the floating gates 74 through the inter-gate dielectric layer 78, as will be described further below with respect to FIGS. 6-12.

Figure 6:
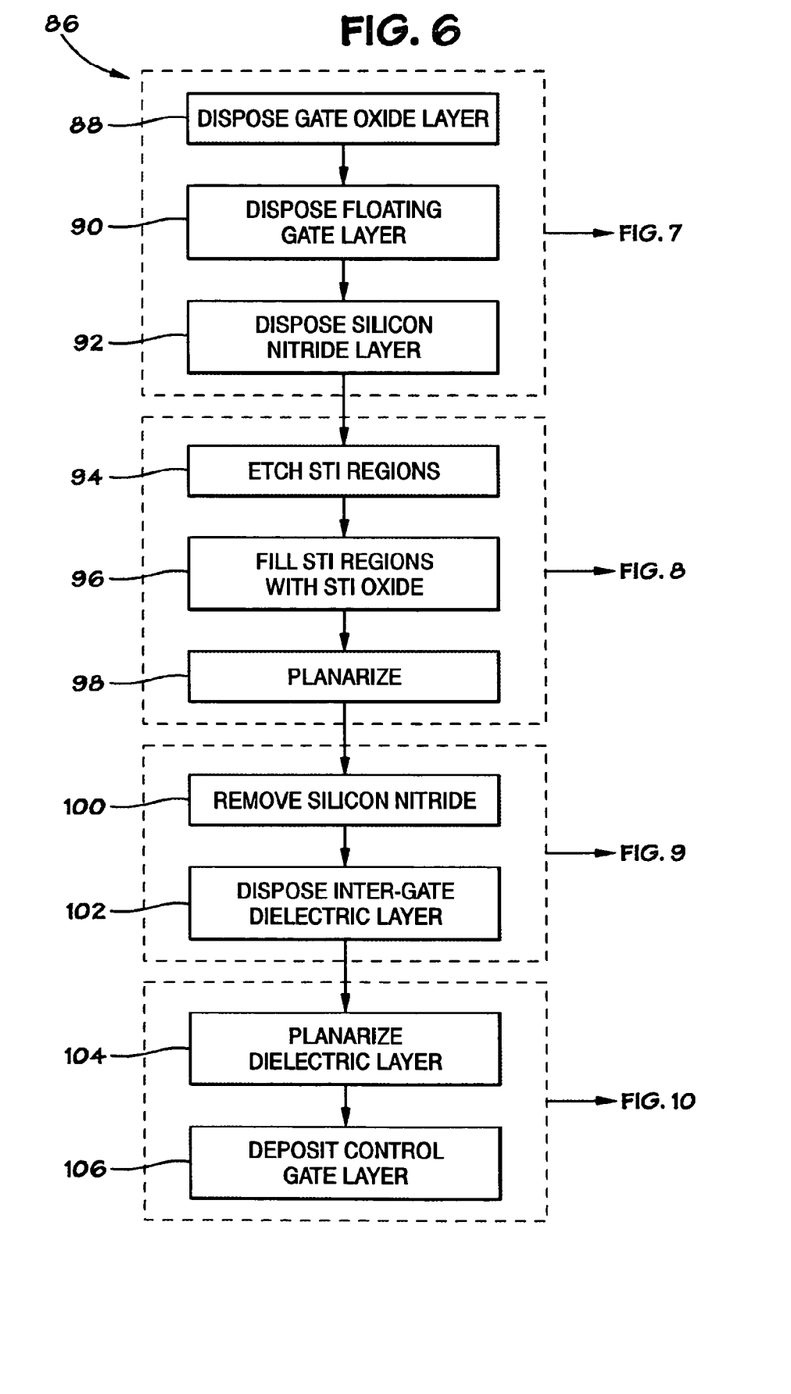
FIG. 6 is a flow chart illustrating an exemplary technique for fabricating floating gate memory devices in accordance with embodiments of the present invention.

FIG. 6, an exemplary process 86, in accordance with one embodiment of the present invention is illustrated. FIGS. 7-11 illustrate cross sectional views of a portion of a floating gate memory array, fabricated in accordance with the exemplary process 86. Accordingly, FIG. 6 will be described in conjunction with the cross-sectional views illustrated in FIGS. 7-11.

Figure 7:
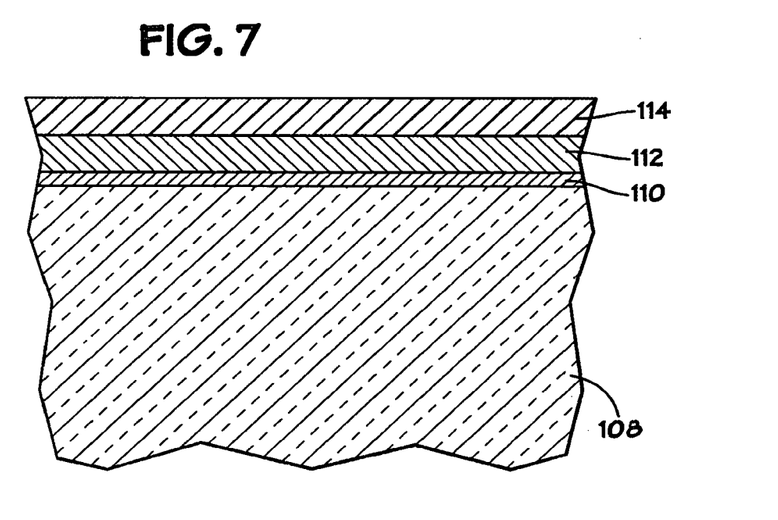
FIGS. 7-11 are cross-sectional views illustrating the fabrication of floating gate memory cells correlating to the flow chart of FIG. 6, in accordance with embodiments of the present invention.

Referring initially to FIG. 7 in conjunction with FIG. 6, a gate oxide layer 110 is disposed or grown on a substrate 108, as indicated in block 88 of FIG. 6. The substrate 108 may comprise silicon or gallium arsenide, for example. The gate oxide layer 110 may comprise silicon dioxide ($SiO_2$), for example. After disposing the gate oxide layer 110, a floating gate material 112 is disposed, as indicated in block 90. The floating gate layer 112 may comprise a polysilicon material, for example. The floating gate layer 112 will be used to form the floating gates of individual transistors, as will be described further below. After deposition of the floating gate layer 112, a dielectric layer, such as a silicon nitride ($SiN_2$) layer 114 is disposed, as indicated in block 92. As will be described further below, the silicon nitride layer 114 is a sacrificial layer employed during fabrication, and will be removed before the floating gate transistors are formed. For reasons discussed further below with reference to FIG. 9, the silicon nitride layer 114 is disposed at a thickness greater than approximately 400 angstroms. In certain embodiments, the silicon nitride layer 114 is deposited at a thickness in the range of 400-700 angstroms.

Figure 8:
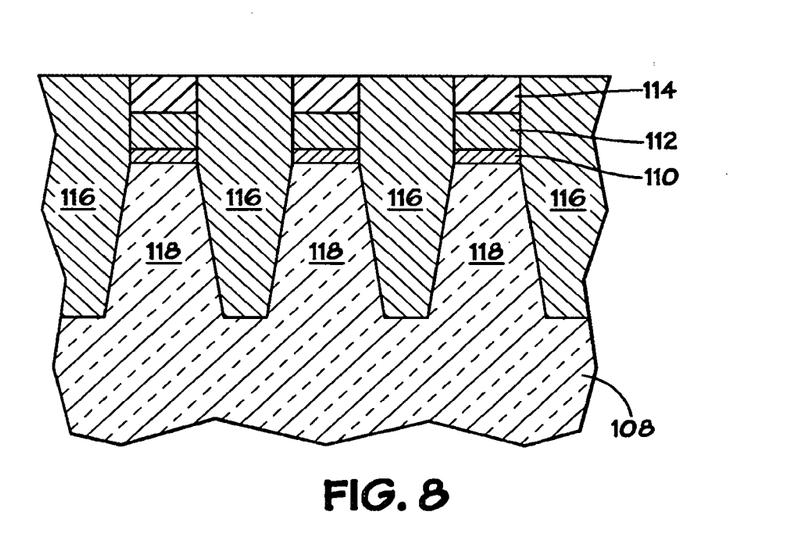

Referring now to FIG. 8 in conjunction with FIG. 6, after deposition of the gate oxide layer 110, floating gate material 112 and silicon nitride layer 114, shallow trenches are etched through each of the deposited layers and the substrate 108 such that shallow trench isolation (STI) regions are formed, as indicated in block 94. Next, a dielectric material, such as an oxide, is deposited in each of the trenches, as indicated in block 96, to form STI oxide regions 116. As previously described, the STI oxide regions 116 define vertical pillars 118 formed in the substrate 108 and extending in a direction into the page along a bit line BL of what will ultimately be the floating gate memory array. The STI oxide regions 116 also provide isolated regions of the gate oxide layer 110, floating gate layer 112 and silicon nitride layer 114 on top of each of the vertical pillars 118 formed in the substrate 108. As will also be appreciated, during deposition of the oxide material which provides the STI oxide regions 116, oxide is generally deposited over the entire structure, including the silicon nitride layer 114. Accordingly, to complete the structure illustrated in FIG. 8, the surface of the oxide may be planarized such that it is removed from the top of the silicon nitride layer 114, as indicated in block 98. The planarization may be by a chemical mechanical planarization (CMP) process, for example. The planarization step may be performed until the silicon nitride layer 114 is isolated into individual regions above each of the pillars 118, as illustrated in FIG. 8.

After planarization of the oxide to create STI oxide regions 116, the silicon nitride 114 is removed as indicated in block 100 of FIG. 6. The silicon nitride 114 may be removed using a standard silicon nitride etchant such as boiling $H_3PO_4$, for example. As will be appreciated, other etchants selective to silicon nitride may be employed. As will be appreciated, while the silicon nitride etch is essentially carried out by use of an etchant selective to silicon nitride, the full etch process may include, pre and post silicon nitride etching steps, such as treating the structure of FIG. 8 with hydrofluoric (HF) acid before and/or after employing the silicon nitride etchant. For instance, the structure may be treated with a diluted HF solution before the silicon nitride etch to remove any remaining oxide left on the silicon nitride 114 after the planarization (step 98 of FIG. 6). The HF treatment before the silicon nitride etch will ensure that the entire surface of the silicon nitride 114 is exposed to the subsequent silicon nitride etchant. Similarly, after the silicon nitride etch, another wet treatment with a diluted HF solution may be employed to remove any native oxide or remaining oxide in the openings left after removal of the silicon nitride 114 by the silicon nitride etch. While the HF solution treatments are advantageous in removing certain undesirable oxides, the HF solution may also etch a portion of the surfaces of the STI oxide 116. In accordance with embodiments of the present invention, once the silicon nitride etching and HF solution treatment steps are performed, it is desirable to retain portions of the STI oxide 116 extending above the plane of the floating gate layer 112 to create a shallow trench for deposition of the inter-gate dielectric layer, as described further below.

Figure 9:
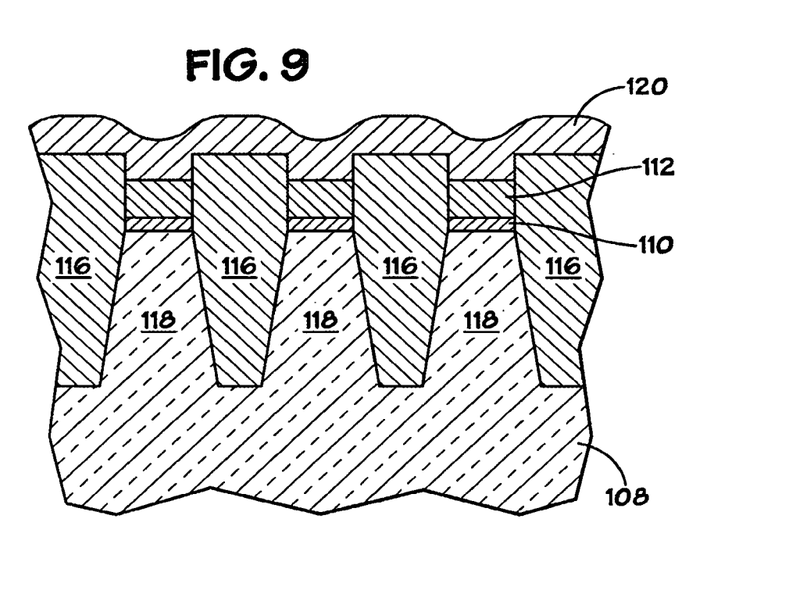

Referring now to FIG. 9 in conjunction with FIG. 6, after removing the silicon nitride layer 114, the inter-gate dielectric layer 120 may be deposited, as indicated in block 102. As used herein, the "inter-gate dielectric layer" refers to the dielectric layer that will exist between the floating gate and the control gate of the floating gate transistor. FIG. 9 illustrates this structure after removal of the silicon nitride layer 114 and after deposition of the inter-gate dielectric layer 120. As previously described, after the silicon nitride etch and HF treatments, a shallow trench remains between each of the STI oxide regions 116, such that the inter-gate dielectric layer 120 may be disposed on top of the floating gate layer 112 and between a portion of the STI oxide regions 116, as illustrated in FIG. 9. To ensure that a portion of the STI oxide regions will extend above the plane of the floating gate layer 112, even after the HF etching steps, the sacrificial silicon nitride layer 114, which will eventually define the openings for the deposition of the inter-gate dielectric layer 120, is disposed at a thickness greater than approximately 400 angstroms. In certain embodiments, the silicon nitride layer 114 is deposited at a thickness in the range of 400-700 angstroms. As will be appreciated, a starting thickness of at least 400 angstroms for the silicon nitride layer 114 will result in the desired trenches being formed between the STI oxide regions 116 after removal of the silicon nitride and HF treatments. That is, enough of the STI oxide regions 116 will still exist above the plane of the floating gate layer 112 to define cavities or trenches in which the inter-gate dielectric 120 may be disposed. The depth of the cavities or trenches above the floating gate layer 112 may be in the range of 50-500 angstroms. The thickness of the silicon nitride layer 114 and the planarization techniques employed (steps 98 and 104 of FIG. 6) may be adjusted to produce a floating gate transistor having a desired thickness of the inter-gate dielectric layer, as will be appreciated.

It should also be noted that while the trenches above the floating gate layer 112 are illustrated as being vertically aligned with the edges of the floating gate layer 112 in FIG. 9, the HF solution treatments may laterally etch the sidewalls of the trenches into the STI oxide regions 116. Accordingly, in certain embodiments, the sidewalls of the trenches created above the floating gate layer 112, may define trenches (and ultimately an inter-gate dielectric layer) that is wider than the underlying floating gate layer 112. Regardless, in accordance with embodiments of the present invention, there will be some amount of the STI oxide region 116 between each of the trenches that will eventually define isolated inter-gate dielectric regions (120A-120C of FIG. 10) for each floating gate transistor, as described further below.

As previously discussed, the inter-gate dielectric layer 120 may advantageously comprise a material having a high dielectric constant (k). As used herein, a "high-k" dielectric material generally refers to materials having a dielectric constant greater than or equal to ten ($k \geq 10$). Suitable high-k materials which may be employed for the inter-gate dielectric layer 120 include, but are not limited to $Al_2O_3$, $Gd_2O_3$, $Yb_2O_3$, $Dy_2O_3$, $Nb_2O_5$, $Y_2O_3$, $La_2O_3$, $ZrO_2$, $HfO_2$, $TiO_2$, $Ta_2O_5$, $SrTiO_3$, $Ba_xSr_{1-x}TiO_3$, $Zr_xSi_{1-x}O_y$, $Hf_xSi_{1-x}O_y$, or $Al_xZr_{1-x}O_2$, or combinations thereof. As previously described, employing a high-k dielectric material reduces the gate leakage while maintaining transistor performance, even with the thickness of the inter-gate dielectric in the floating gate transistor being very thin.

Figure 10:
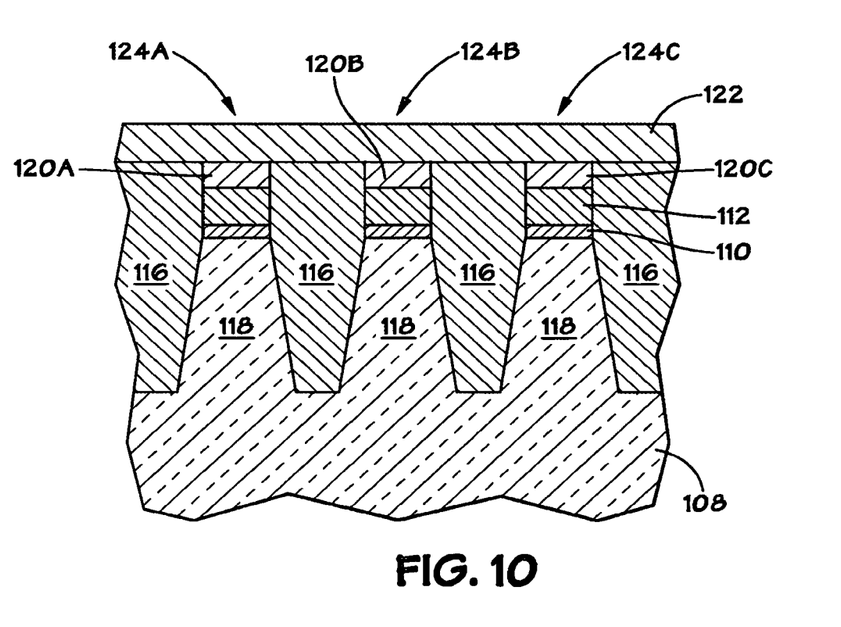

To complete the formation of the floating gate transistors, the inter-gate dielectric layer 120 is planarized such that it is even with the top surface of the STI oxide regions 116, and thus electrically isolated from adjacent inter-gate dielectric regions, as indicated in block 104 of FIG. 6. Thus, as best illustrated in FIG. 10, after planarization of the inter-gate dielectric layer 120 (block 104 of FIG. 6), individually isolated inter-gate dielectric regions 120A-120C remain. As will be appreciated, by creating electrically isolated inter-gate oxide regions 120A-120C for each transistor, rather than employing a continuous dielectric layer over each of the floating gates 112, the capacitive path through the inter-gate dielectric layer is eliminated, thereby advantageously reducing the FG-FG interference, previously described with reference to FIGS. 4 and 5. The thickness of each inter-gate dielectric region 120A-120C is in the range of approximately 50-500 angstroms. Finally, to complete the floating gate transistors 124A-124C in accordance with embodiments of the present invention, the control gate layer 122 is deposited, as illustrated in FIG. 10, and indicated in block 106 of FIG. 6.

Figure 11:
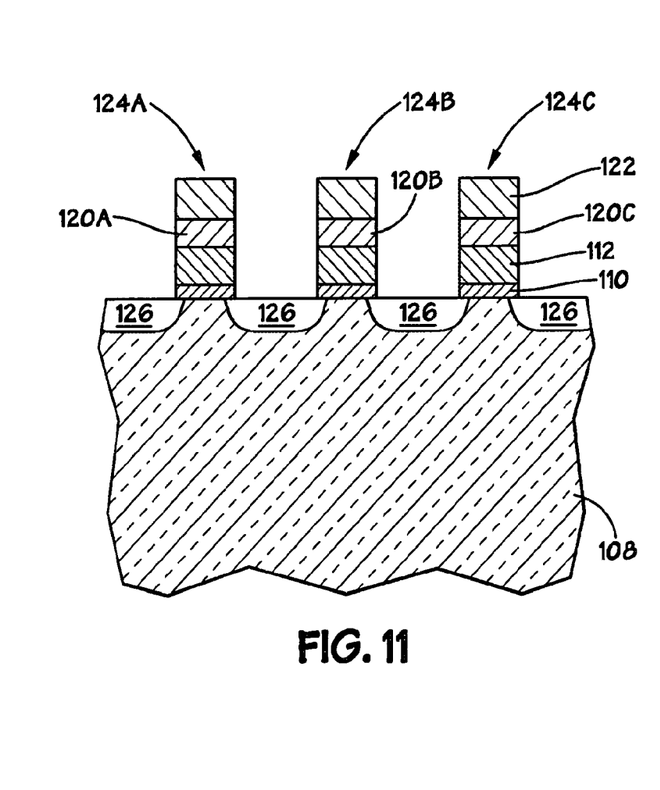

Referring now to FIG. 11, an alternate view of the final structure illustrated in FIG. 10 is shown. FIG. 11 illustrates the structure of FIG. 10 taken along the bit line BL, rather than the word line WL. That is, in the view shown in FIG. 11, the word lines WL extend into the page. As illustrated in FIG. 11, the floating gate 112, the inter-gate dielectric regions 120A-120C and the control gate 122 for each floating gate transistor 124A-124C is electrically isolated from the adjacent device, along the bit line BL. Also illustrated in FIG. 11 are the source and drain diffusion regions 126 formed in the pillars 118 of the substrate 108, as will be appreciated by those skilled in the art.

Figure 12:
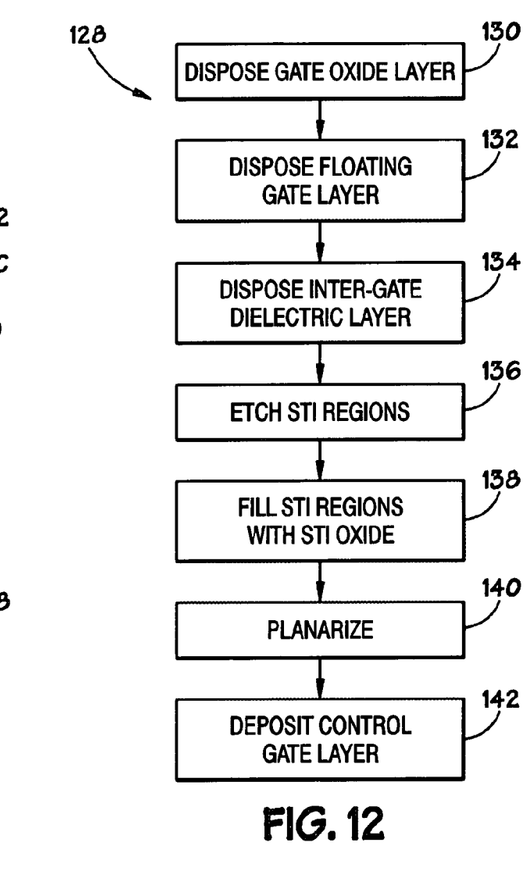
FIG. 12 is a flow chart illustrating an alternative method of fabricating floating gate memory cells in accordance with further embodiments of the present invention.

Referring now to FIG. 12, an alternate process 128 for fabricating floating gate transistors having isolated inter-gate dielectric regions, in accordance with further embodiments of the present invention, is illustrated. In the process 128, a sacrificial silicon nitride layer is not employed. Instead, the gate oxide layer and floating gate layer are disposed on the substrate, as previously described, and indicated in blocks 130 and 132 of FIG. 12. Rather than depositing a silicon nitride layer on top of the floating gate layer, as previously described, the inter-gate dielectric layer is deposited directly onto the floating gate layer, as indicated in block 134. After deposition of the inter-gate dielectric layer, the inter-gate dielectric layer, the floating gate layer, the gate oxide layer and the underlying substrate are etched to form STI regions, as indicated in block 136. The formation of the STI regions after deposition of the inter-gate dielectric layer will create isolated inter-gate dielectric regions on top of each pillar defined by the trench. Next, the STI oxide is disposed in the STI regions, as indicated in block 138. Next, the structure is planarized to form the isolated STI oxide regions, as indicated in block 140. After planarization, the control gate is deposited, as indicated in block 142.

Another process, similar to the processes described with regard to the FIGS. 6 and 12, may also be employed. The present exemplary process is similar to the process described with regard to FIG. 12, except that after deposition of the inter-gate dielectric layer (block 134) and before the STI regions are etched (block 136), a polysilicon layer is deposited on the inter-gate dielectric layer and a silicon nitride layer is deposited on the polysilicon layer. After deposition of the polysilicon layer and the silicon nitride layer, the STI regions may be etched (block 138). After the STI regions are filled with an STI oxide (block 138) and the surface is planarized (block 140), the silicon nitride layer is removed. After removal of the silicon nitride layer, isolated regions of the deposited polysilicon layer remain over the inter-gate dielectric layer. Next, the control gate layer is deposited (block 142) over the structure. As will be appreciated, the control gate layer is disposed such that it is in direct contact with the isolated polysilicon regions. The polysilicon regions are electrically conductive and form vertical extension of the control gate layer, extending downward toward respective underlying floating gate regions.

While embodiments of the invention may be susceptible to various modifications and alternative forms, specific embodiments have been shown by way of example in the drawings and have been described in detail herein. However, it should be understood that the invention is not intended to be limited to the particular forms disclosed. Rather, embodiments of the invention are to cover all modifications, equivalents, and alternatives falling within the spirit and scope of these embodiments, as defined by the following appended claims.

What is claimed is:

1. A memory array comprising:
a plurality of transistors arranged in a plurality of rows and columns, wherein each of the plurality of transistors comprises:
a floating gate;
a control gate; and
an inter-gate dielectric layer disposed between the floating gate and the control gate; and
wherein the respective inter-gate dielectric layer of each of the plurality of transistors is isolated from the inter-gate dielectric layer of each of the other of the plurality of transistors by a plurality of substantially parallel isolation regions having an upper surface that is substantially planar;
wherein the control gate comprises a top surface and a bottom surface, wherein each of the top surface and the bottom surface is substantially planar; and
wherein an upper surface of the inter-gate dielectric layer of each of the plurality of transistors is planar with the upper surface of each of the plurality of substantially parallel isolation regions.

2. The memory array, as set forth in claim 1, wherein the inter-gate dielectric layer of each of the plurality of transistors comprises a high-k dielectric.

3. The memory array, as set forth in claim 1, wherein the inter-gate dielectric layer of each of the plurality of transistors comprises one of $Al_2O_3$, $Gd_2O_3$, $Yb_2O_3$, $Dy_2O_3$, $Nb_2O_5$, $Y_2O_3$, $La_2O_3$, $ZrO_2$, $HfO_2$, $TiO_2$, $Ta_2O_5$, $SrTiO_3$, $Ba_xSr_{1-x}TiO_3$, $Zr_xSi_{1-x}O_y$, $Hf_xSi_{1-x}O_y$, or $Al_xZr_{1-x}O_2$, or combinations thereof.

4. The memory array, as set forth in claim 1, wherein the inter-gate dielectric layer of each of the plurality of transistors has a respective width approximately equal to a respective width the floating gate of each of the plurality of transistors.

5. The memory array, as set forth in claim 1, wherein the inter-gate dielectric layer of each of the plurality of transistors has a respective width greater than a respective width the floating gate of each of the plurality of transistors.

6. The memory array, as set forth in claim 1, wherein each of the floating gate and the control gate of each of the plurality of transistors comprises polysilicon.

7. The memory array, as set forth in claim 1, wherein the memory array comprises a NAND memory array.

8. The memory array, as set forth in claim 1, wherein each of the charge storage region and the control gate of each of the plurality of transistors comprises polysilicon.

9. The memory array, as set forth in claim 1, wherein each floating gate is isolated from each adjacent floating gate, and wherein each inter-gate dielectric region is isolated from each adjacent inter-gate dielectric region.

10. A memory array comprising:
a plurality of transistors arranged in a plurality of rows and columns, wherein each of the plurality of transistors comprises:
a charge storage region;
a control gate; and
an inter-gate dielectric region disposed between the charge storage region and the control gate; and
wherein the respective inter-gate dielectric region of each of the plurality of transistors is isolated from the inter-gate dielectric region of each of the other of the plurality of transistors by a plurality of substantially parallel isolation regions having an upper surface that is substantially planar, and
wherein the control gate comprises a top surface and a bottom surface, wherein each of the top surface and the bottom surface is substantially planar; and
wherein an upper surface of the inter-gate dielectric layer of each of the plurality of transistors is planar with the upper surface of each of the plurality of substantially parallel isolation regions.

11. The memory array, as set forth in claim 10, wherein the inter-gate dielectric region of each of the plurality of transistors has a respective width approximately equal to a respective width the charge storage region of each of the plurality of transistors.

12. The memory array, as set forth in claim 10, wherein the inter-gate dielectric region of each of the plurality of transistors has a respective width greater than a respective width the charge storage region of each of the plurality of transistors.

13. A floating gate memory array comprising:
a plurality of transistors arranged in a plurality of rows and columns, wherein each of the plurality of transistors comprises:
a gate oxide formed on a semiconductor;
a floating gate formed on the gate oxide;
a plurality of substantially parallel trenches through each of the floating gate, the gate oxide and the semiconductor, wherein each of the plurality of trenches comprises an isolation oxide region therein;
an inter-gate dielectric region formed in a cavity on top of the floating gate layer, the cavity having sidewalls defined by the isolation oxide; and
a control gate on each of the inter-gate dielectric regions, wherein the control gate is substantially planar and extends continuously between two or more of the plurality of transistors.

14. The memory array, as set forth in claim 13, wherein the inter-gate dielectric region comprises a thickness of greater than or equal to 400 angstroms.

15. The memory array, as set forth in claim 13, wherein the inter-gate dielectric region comprises a thickness in the range of approximately 400-700 angstroms.

16. The memory array, as set forth in claim 13, and upper surface of the inter-gate dielectric region in each of the cavities is planar with an upper surface of each adjacent isolation oxide region.

17. A memory array comprising:
a plurality of transistors arranged adjacent to one another, wherein each of the plurality of transistors comprises:
a floating gate;
an inter-gate dielectric formed directly on the floating gate; and
a control gate formed directly on the inter-gate dielectric;
wherein the floating gate of each respective one of the plurality of transistors is isolated from each adjacent floating gate;
wherein the inter-gate dielectric of each respective one of the plurality of transistors is isolated from each adjacent inter-gate dielectric; and
wherein the control gate is substantially planar and continuous across each of the plurality of transistors.

18. The memory array, as set forth in claim 17, wherein the inter-gate dielectric is a high-k dielectric.

19. The memory array, as set forth in claim 17, comprising isolation oxide regions isolating each of the adjacent floating gates from one another, and isolating each of the adjacent inter-gate dielectrics from one another.

20. The memory array, as set forth in claim 17, wherein the memory array comprises a NAND memory array.

\* \* \* \* \*